(12) United States Patent
Hirose

(10) Patent No.: US 8,093,682 B2
(45) Date of Patent: Jan. 10, 2012

(54) RESISTANCE MEMORY ELEMENT

(75) Inventor: Sakyo Hirose, Yasu (JP)

(73) Assignee: Murata Manufacturing Co., Ltd., Nagaokakyo-Shi, Kyoto (JP)

( * ) Notice: Subject to any disclaimer, the term of this patent is extended or adjusted under 35 U.S.C. 154(b) by 322 days.

(21) Appl. No.: 12/567,373

(22) Filed: Sep. 25, 2009

(65) Prior Publication Data

US 2010/0001254 A1 Jan. 7, 2010

Related U.S. Application Data

(63) Continuation of application No. PCT/JP2008/055272, filed on Mar. 21, 2008.

(30) Foreign Application Priority Data

Mar. 26, 2007 (JP) ................................. 2007-078272
Sep. 3, 2007 (JP) ................................. 2007-227549

(51) Int. Cl.
*H01L 29/00* (2006.01)
*H01L 21/02* (2006.01)
*H01L 23/12* (2006.01)
*H01L 23/053* (2006.01)
*H01G 4/06* (2006.01)

(52) U.S. Cl. ........ 257/537; 257/295; 257/700; 257/703; 257/E39.009; 361/313; 361/321.4; 361/321.5

(58) Field of Classification Search .................. 257/2, 4, 257/E45.002, 295, 700, 703, 537, E39.009; 361/313, 321.4–321.5
See application file for complete search history.

(56) References Cited

U.S. PATENT DOCUMENTS

| | | | |
|---|---|---|---|
| 5,635,433 A * | 6/1997 | Sengupta | 501/137 |
| 5,862,034 A * | 1/1999 | Sato et al. | 361/321.5 |
| 7,160,827 B2 * | 1/2007 | Banno | 501/138 |
| 7,397,649 B2 * | 7/2008 | Muto et al. | 361/321.4 |
| 7,505,249 B2 * | 3/2009 | Komatsu et al. | 361/321.1 |
| 7,525,832 B2 | 4/2009 | Muraoka et al. | |
| 7,595,975 B2 * | 9/2009 | Suzuki et al. | 361/321.4 |

(Continued)

FOREIGN PATENT DOCUMENTS

JP 05-036931 A 2/1993

(Continued)

OTHER PUBLICATIONS

Fuji, et al., "Hysteric current-voltage characteristics and resistance switching at an epitaxial oxide Schottky junction SrRuO3/SrTi0.99Nb0.01O3", Applied Physics Letters 86 012107, 2005, pp. 1-3.

(Continued)

*Primary Examiner* — Zandra Smith
*Assistant Examiner* — Jeremy Joy
(74) *Attorney, Agent, or Firm* — Dickstein Shapiro LLP

(57) ABSTRACT

A resistance memory element is provided which has a relatively high switching voltage and whose resistance can be changed at a relatively high rate. The resistance memory element includes an elementary body and a pair of electrodes opposing each other with at least part of the elementary body therebetween. The elementary body is made of a semiconductor ceramic expressed by a formula: $\{(Sr_{1-x}M_x)_{1-y}A_y\}(Ti_{1-z}B_z)O_3$ (wherein M represents at least one of Ba and Ca, A represents at least one element selected from the group consisting of Y and rare earth elements, and B represents at least one of Nb and Ta), and satisfies $0<x\leq0.5$ and $0.001\leq y+z\leq0.02$ (where $0\leq y\leq0.02$ and $0\leq z\leq0.02$); $0.5<x\leq0.8$ and $0.003\leq y+z\leq0.02$ (where $0\leq y\leq0.02$ and $0\leq z\leq0.02$); or $0.8<x\leq1.0$ and $0.005\leq y+z\leq0.01$ (where $0\leq y\leq0.02$ and $0\leq z\leq0.02$).

12 Claims, 1 Drawing Sheet

U.S. PATENT DOCUMENTS

| | | | |
|---|---|---|---|
| 7,649,768 B2* | 1/2010 | Hirose | 365/158 |
| 7,691,286 B2* | 4/2010 | Kawada et al. | 252/62.9 R |
| 7,911,764 B2* | 3/2011 | Sasabayashi et al. | 361/321.4 |
| 2002/0039272 A1* | 4/2002 | Mizuno et al. | 361/311 |
| 2004/0145856 A1* | 7/2004 | Nakamura et al. | 361/311 |
| 2006/0002174 A1 | 1/2006 | Hosoi et al. | |
| 2006/0154417 A1 | 7/2006 | Shinmura et al. | |
| 2006/0215445 A1 | 9/2006 | Baek et al. | |
| 2008/0107800 A1* | 5/2008 | Randall et al. | 427/79 |
| 2008/0112109 A1* | 5/2008 | Muto et al. | 361/301.4 |
| 2009/0102597 A1 | 4/2009 | Ishihara | |
| 2009/0102598 A1 | 4/2009 | Yamazaki et al. | |

FOREIGN PATENT DOCUMENTS

| | | |
|---|---|---|
| JP | 02727626 | 3/1998 |
| JP | 2002-537627 A | 11/2002 |
| JP | 2002-541699 A | 12/2002 |
| JP | 2006-019444 A | 1/2006 |
| JP | 2006-196516 A | 7/2006 |
| JP | 2006-279042 A | 10/2006 |
| JP | 2006-324447 A | 11/2006 |
| JP | 2006-324625 A | 11/2006 |
| JP | 2007-027537 A | 2/2007 |
| WO | WO-2007/007606 A1 | 1/2007 |

OTHER PUBLICATIONS

Written opinion of corresponding International Application JP 2008-055272, dated Jun. 10, 2008.

International Search Reoprt of corresponding International Application JP 2008-055272, dated Jun. 10, 2008.

* cited by examiner

RESISTANCE MEMORY ELEMENT

CROSS REFERENCE TO RELATED APPLICATIONS

The present application is a continuation of International Application No. PCT/JP2008/055272, filed Mar. 21, 2008, which claims priority to Japanese Patent Application No. JP2007-078272, filed Mar. 26, 2007, and Japanese Patent Application No. JP2007-227549, filed Sep. 3, 2007, the entire contents of each of these applications being incorporated herein by reference in their entirety.

1. FIELD OF THE INVENTION

The present invention relates to resistance memory elements, and particularly, to a resistance memory element including an elementary body made of a polycrystalline semiconductor ceramic.

2. DESCRIPTION OF THE RELATED ART

A resistance memory element includes an elementary body that can memorize resistance. This elementary body originally has, for example, a relatively high resistance. However, when at least a predetermined voltage is applied to the elementary body, the resistance is reduced and a low resistance state is maintained or memorized even after the applied voltage is removed. In contrast, when at least the predetermined voltage is applied in the opposite direction to the elementary body in a low resistance state, the resistance is increased and a high resistance state is maintained or memorized even after the voltage is removed.

Such a resistance memory element can switch between a high resistance state and a low resistance state by applying a voltage equal to or greater than a threshold in a positive direction or the opposite direction, and thus, can change and memorize the resistance. Such resistive switching enables the resistance memory element to function not only as a memory element, but also as a switching element.

A known resistance memory element is described in, for example, T. Fujii et al., "Hysteretic Current-Voltage Characteristics and Resistance Switching At An Epitaxial Oxide Schottky Junction $SrRuO_3/SrTi_{0.99}Nb_{0.01}O_3$", APPLIED PHYSICS LETTERS 86, 012107 (2005). In a resistance memory element described in this published article, an interface between different types of material, more specifically, the bonded interface between a $SrTiO_3$ monocrystalline substrate and a $SrRuO_3$ thin film (monocrystalline thin film), is capable of memorizing resistances. This resistance memory element has a switching voltage not greater than about 3 V, and accordingly, switches at a relatively low voltage. The switching voltage refers to a voltage at which the resistance state is changed.

Many of the circuits in which a resistance memory element may be used are operated at a rated voltage of greater than about 3 V. When a resistance memory element as described in the above published article is used as a switching element with a relatively high driving voltage, the switching voltage must be greater than the rated voltage.

However, since the switching voltage of the resistance memory element of the above published article is not greater than about 3 V, the element may switch at the driving voltage. Thus, this element cannot be used as a switching element with a relatively high driving voltage.

If a switching element that switches at a voltage of, for example, at least about 5V is produced, another resistor must be provided in series. In this instance, the switching voltage can be set to a relatively high voltage, but the power consumption is increased due to the additional resistor. In addition, the resistor disadvantageously reduces the variation of resistances switched.

Varistors are also relevant to the present invention. For example, Japanese Patent No. 2727626 discloses a multilayer varistor including a $SrTiO_3$ elementary body including various elements and internal electrodes made primarily of Pd in the elementary body. In order to produce such a varistor, an element that functions as an acceptor is actively diffused or added and re-oxidation is performed to form a grain boundary barrier after a reduction treatment for forming semiconductor. When at least a predetermined voltage is applied to the varistor, the varistor changes into a low resistance state, but the state is not maintained or memorized and is returned to the initial state after the applied voltage is removed. Thus, the varistor is not a resistance memory element.

SUMMARY OF THE INVENTION

To overcome the problems described above, preferred embodiments of the present invention provide a resistance memory element having a relatively high switching voltage, whose resistance can be changed at a relatively high rate.

The preferred embodiments of the present invention are directed to a resistance memory element including an elementary body and at least a pair of opposing electrodes opposing each other with at least a portion of the elementary body therebetween. When a switching voltage is applied between the pair of electrodes in a first direction, the portion of the elementary body disposed between the pair of electrodes comes to a low resistance state and the low resistance state is maintained even after the switching voltage in the first direction is removed. When a switching voltage is applied between the pair of electrodes in a second direction opposite to the first direction, the portion of the elementary body disposed between the pair of electrodes comes to a high resistance state and the high resistance state is maintained even after the switching voltage in the second direction is removed. The elementary body is made of the following semiconductor ceramic.

In a preferred embodiment of the present invention, the resistance memory element 1 includes an elementary body 2 made of a semiconductor ceramic is expressed by the formula: $\{(Sr_{1-x}M_x)_{1-y}A_y\}(Ti_{1-z}B_z)O_3$ (where M represents at least one of Ba and Ca, A represents at least one element selected from the group consisting of Y and rare earth elements, and B represents at least one of Nb and Ta). The composition of the above formula satisfies the following conditions:

When $0.5<x\leq0.5$ holds, $0.001\leq y+z\leq0.02$ holds (where $0\leq y\leq0.02$ and $0\leq z\leq0.02$);

when $0.5<x\leq0.8$ holds, $0.003\leq y+z\leq0.02$ holds (where $0\leq y\leq0.02$ and $0\leq z\leq0.02$); and when $0.8<x\leq1.0$ holds, $0.005\leq y+z\leq0.01$ (where $0\leq y\leq0.02$ and $0\leq z\leq0.02$).

Preferably, the composition of the formula of the semiconductor ceramic satisfies $0<x\leq0.5$ and $0.005\leq y+z\leq0.01$ (where $0\leq y\leq0.02$ and $0\leq z\leq0.02$).

Preferably, the elementary body has at least one grain boundary between the pair of electrodes.

Preferably, the electrodes are formed by being fired together with the elementary body.

Preferably, the electrodes include at least one metal selected from the group consisting of Pd, Pt, Ag—Pd, Au, Ru, and Ir, for example.

ADVANTAGES

According to preferred embodiments of the present invention, switching between a low resistance state and a high resistance state can be achieved with a high switching voltage of, for example, at least 5 V and the resistance can be changed at a high rate of, for example, at least about 5000% even with relatively high driving voltage. Also, the switching voltage can be controlled by controlling the number of grain boundaries between the pair of electrodes, that is, the distance between the electrodes or the thickness of the elementary body.

According to a preferred embodiment of the present invention, the semiconductor ceramic expressed by the above formula can change its resistance at a high rate of, for example, at least about 10000% when the formula satisfies $0<x\leq0.5$ and $0.005\leq y+z\leq 0.01$ (where $0\leq y\leq 0.02$ and $0\leq z\leq 0.02$).

If the elementary body has at least one grain boundary between the pair of electrodes, only the grain boundary can produce relatively high switching characteristics without using an electrode forming a Schottky barrier, and a large resistance variation can be achieved.

If the electrode is formed by being fired together with the elementary body, the interfaces between the electrodes and the elementary body are strengthened.

If the electrode includes at least one metal selected from the group consisting of Pd, Pt, Ag—Pd, Au, Ru, and Ir, for example, a Schottky junction can be produced between the electrodes and the elementary body.

Figure 1:
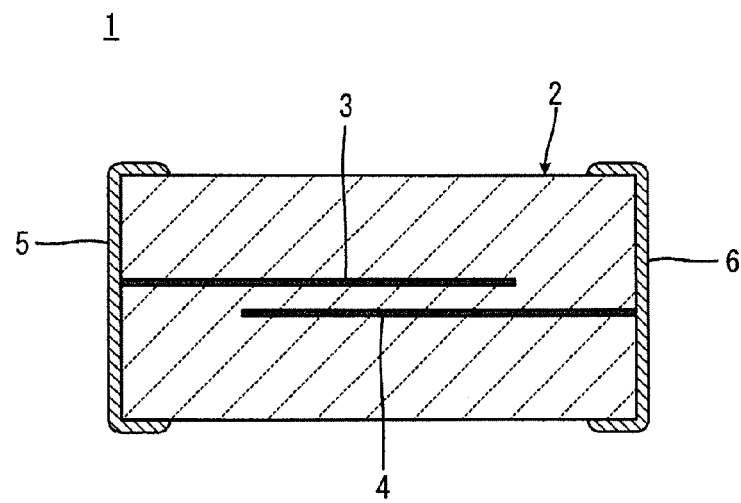
FIG. 1 is a sectional view of a resistance memory element 1 of a preferred embodiment of the present invention.

REFERENCE NUMERALS 1 resistance memory element
2 elementary body
3, 4 opposing electrodes
5, 6 terminal electrodes

DETAILED DESCRIPTION OF THE INVENTION

FIG. 1 is a sectional view of a resistance memory element 1 according to a preferred embodiment of the present invention.

The resistance memory element 1 includes an elementary body 2 made of a semiconductor ceramic expressed by the formula: $\{(Sr_{1-x}M_x)_{1-y}A_y\}(Ti_{1-z}B_z)O_3$ (wherein M represents at least one of Ba and Ca, A represents at least one element selected from the group consisting of Y and rare earth elements, and B represents at least one of Nb and Ta).

The semiconductor ceramic is selected so that the composition of the above formula satisfies the following conditions: when $0<x\leq0.5$, $0.001<y+z\leq0.02$ (wherein $0\leq y\leq0.02$ and $0\leq z\leq0.02$); when $0.5<x\leq0.8$, $0.003<y+z\leq0.02$ (wherein $0\leq y\leq0.02$ and $0\leq z\leq0.02$); or when $0.8<x\leq1.0$, $0.005\leq y+z\leq0.01$ holds (wherein $0<y\leq0.02$ and, $0\leq z\leq0.02$).

The resistance memory element 1 also includes at least a pair of opposing electrodes 3 and 4 that oppose each other with at least a portion of the elementary body 2 disposed therebetween. In the present embodiment, the elementary body 2 has a multilayer structure. The opposing electrodes 3 and 4 are disposed in the elementary body 2 with at least a portion of the elementary body 2 disposed therebetween, and are fired in that state simultaneously with firing the elementary body 2. By firing the opposing electrodes 3 and 4 and the elementary body 2 at the same time at a relatively high temperature, their interfaces can be strengthened to increase the withstanding voltage of the resistance memory element 1.

Preferably, the opposing electrodes 3 and 4 include at least one metal selected from the group consisting of Pd, Pt, Ag—Pd, Au, Ru, and Ir, for example. The opposing electrodes 3 and 4 made of these metals can produce Schottky junctions between the electrodes and elementary body 2.

The resistance memory element 1 further includes terminal electrodes 5 and 6. The terminal electrodes 5 and 6 are respectively formed on both ends of the elementary body 2, and electrically connected to the opposing electrodes 3 and 4, respectively. The terminal electrodes 5 and 6 are formed by, for example, burning an electroconductive paste including silver on the elementary body 2.

When a switching voltage is applied between the opposing electrodes 3 and 4 through the terminal electrodes 5 and 6 in a first direction, the portion of the elementary body 2 between the opposing electrodes 3 and 4 comes to a low resistance state, and the low resistance state of the elementary body 2 is maintained even after the switching voltage in the first direction is removed. On the other hand, when a switching voltage is applied to the opposing electrodes 3 and 4 in a second direction opposite to the first direction, the portion of the elementary body 2 between the opposing electrodes 3 and 4 comes to a high resistance state, and the high resistance state is maintained even after the switching voltage in the second direction is removed. The resistance memory element 1 according to preferred embodiment of the present invention can operate stably and properly with relatively high driving voltages because above described switching voltage becomes high as at least about 5 V and enables the resistance to change at a high rate of, for example, at least about 5000%.

When the above-described semiconductor ceramic of the elementary body 2 satisfies more strict relationships $0<x\leq0.5$ and $0.005\leq y+z\leq0.01$ (where $0\leq y\leq0.02$ and $0\leq z\leq0.02$) in the above formula, the resistance can be changed at a higher rate of, for example, at least about 10000%.

The semiconductor ceramic of the elementary body 2 changes its switching voltage depending on the number of grain boundaries disposed in the portion between the opposing electrodes 3 and 4. Thus, by controlling the number of grain boundaries disposed in the portion between the opposing electrodes 3 and 4, that is, by controlling the distance between the opposing electrodes 3 and 4, the switching voltage can be controlled.

The mechanism of the resistance memory element 1 enabling such characteristics has not fully been understood. It is generally considered that resistance switching occurs at the interface between a semiconductor and a metal, and that the changes in resistance result from the semiconductor. In the preferred embodiment of the present invention, the elementary body 2 is made of a semiconductor ceramic having a specific composition and has at least one grain boundary between the pair of electrodes 3 and 4, and the semiconductor ceramic is preferably polycrystalline. Although the ceramic itself is semiconductive and therefore has a low resistance, the grain boundaries in the ceramic have high resistances. Consequently, the voltage applied to the electrodes 3 and 4 producing resistance switching is dispersed in the interfaces with the electrodes and the grain boundaries to reduce the effective voltage. Thus, a switching voltage greater than that of the resistance memory element described in the above published article can be applied.

The reason why the grain boundaries in the semiconductor ceramic of the preferred embodiment of the present invention have high resistances is probably not only that the conduction electrons are scattered at the grain boundaries and reduced mobility, but also that shallow grain boundary levels are produced and act as electron traps to form a low grain boundary barrier.

If it is assumed that only the scattering of conduction electrons at grain boundaries increases the resistance, the structure is such that a resistor is connected in series to the resistance memory element described in the above published article and the resistance variation is expressed by the following equation: resistance variation={(series resistance component+element resistance in a high resistance state)−(series resistance+element resistance in a low resistance state)}/(series resistance component+element resistance in a low resistance state).

In the resistance memory element of the present preferred embodiment, if only the resistances at the interfaces with the electrodes are varied and, thus, the resistance switching occurs, the resistance of the element corresponds to the resistance at grain boundaries in the above equation, and the series resistance component corresponds to ceramic. Since the ceramic itself has a relatively high resistance, the resistance variation should be reduced. Assuming that the series resistance component is about 1 MΩ and is constant, even if the resistance of an element is varied, for example, between about 1Ω in a low resistance state and about 1 MΩ in a high resistance state, the resistance is varied only by about two times, for example, between about 1 MΩ+1Ω in a low resistance state and about 1 MΩ+1 MΩ in a high resistance state because of the presence of the series resistance component. This suggests that the reason why the resistance of the resistance memory element 1 according to preferred embodiment of the present invention is high is not solely due to the fact that conduction electrons are scattered at the grain boundaries and have reduced mobility.

Thus, the resistance memory element 1 according to the preferred embodiment of the present invention can switch its resistance state at a relatively high voltage, and, in addition, the resistance can be varied at a rate equal to or higher than that of the element described in the above published article. It is believed that low barriers produced at the grain boundaries greatly contribute to such a large resistance variation. Thus, by applying a switching voltage, the height of the barriers at the grain boundaries is varied, and thus, the resistance may be varied at a high rate. If it is assumed that resistance switching occurs only by increasing the grain boundary resistance to reduce the resistance at the interfaces with the electrodes 3 and 4, as described above, then the cause of the high resistance variation cannot be explained.

The resistance switching characteristics of the resistance memory element 1 according to preferred embodiments of the present invention will now be described in detail.

Figure 2:
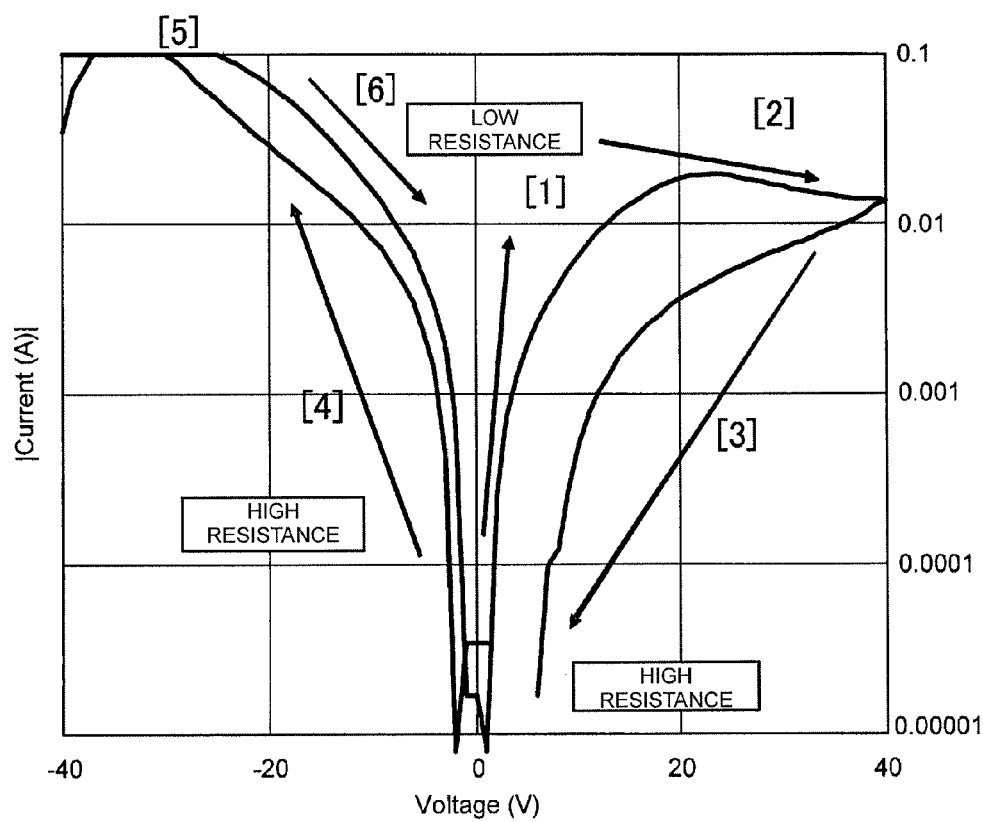
FIG. 2 is a graph of typical current-voltage characteristics of a resistance memory element of the preferred embodiment of the present invention.

FIG. 2 is typical current-voltage characteristics (I-V characteristics) of the resistance memory element 1 according to preferred embodiments of the present invention. The resistance memory element 1 having the I-V characteristics shown in FIG. 2 includes an elementary body made of a semiconductor ceramic having a composition expressed by $Ba_{0.992}La_{0.008}TiO_3$, and is equivalent to a specific sample which satisfies preferred ranges of various preferred embodiments of the present invention in the experiments described below. In order to obtain the I-V characteristics shown in FIG. 2, voltage pulses having a pulse width of about 0.1 s are applied in increments of about 1 V, and the flowing current is measured.

Referring to FIG. 2, when voltages are applied from about 0 to about 40 V, the current increases up to about 12 mA at a voltage of about 20 V [1]. When the voltage is further increased up to about 40 V, the current decreases to about 10 mA [2]. When the voltage is then reduced from 40 V to 0 V, the element does not show the same I-V characteristics between the increase and the decrease in voltage [3], and is changed from a low resistance state to a high resistance state.

When voltages are subsequently applied from 0 to −40 V [4], the current reaches 100 mA (current limit) at −40 V [5]. When voltages are then applied from −40 V to 0 V, the element changes from a high resistance state without showing the same I-V characteristics between the increase and the decrease in voltage [6], thus changing from a high resistance state to a low resistance state.

As described above, when voltages are applied in a positive direction, the ceramic switches from a low resistance state to a high resistance state. On the other hand, when voltages are applied in a negative direction, the ceramic switches from a high resistance state to a low resistance state. This resistance switching phenomenon is performed repeatedly in the same manner.

As shown in FIG. 2, the resistance memory element 1 according to preferred embodiments of the present invention has a switching voltage of several tens of volts. The above described published article shows a resistance memory element having a switching voltage of about 3 V or less. The switching voltage according to preferred embodiments of the present invention, several tens of volts is higher than that of the resistance memory element of the above published article.

The pulse width dependence of the changes in resistance of the resistance memory element 1 having the I-V characteristics shown in FIG. 2 was examined by applying a voltage of about 50 V to the element 1 while the pulse width is varied to, for example, about 1 ms, about 10 ms, and about 100 ms. As a result, it was shown that the resistance is not varied even when a pulsed voltage with a pulse width of, for example, about 1 ms or about 10 ms is applied, and that the resistance is not varied until a pulsed voltage with a pulse width of about 100 ms is applied. On the other hand, when a voltage of 3 V was applied to the resistance memory element of the above published article, the element switched to a high resistance state (the current was reduced) at a pulse width of about 1 ms. When a voltage of 3 V with a pulse width of about 10 ms was applied, the resistance of the element was further increased.

These results show that in order to switch the resistance states in the resistance memory element 1, a predetermined voltage must be applied, and in addition, the voltage must have a greater pulse width than the voltage applied to the resistance memory element of the above published article.

Accordingly, if the element according to preferred embodiments of the present invention is used as a switching element, such as a signal circuit or a power supply circuit, the resistance state is very stable against spike noises (pulsed noises in voltage or current) in the circuit. Thus, the resistance state of the element is not changed even if spike noises in the circuit enter the element, and accordingly, a malfunction does not easily occur.

Although in the resistance memory element 1 shown in FIG. 1, the opposing electrodes 3 and 4 are preferably disposed in the middle of the elementary body 2 in the thickness direction, the opposing electrodes 3 and 4 may be displaced toward either end in the thickness direction. In an extreme case, one of the opposing electrodes 3 and 4 may be disposed on the external surface of the elementary body 2. Alternatively, both the opposing electrodes 3 and 4 may be disposed with a predetermined distance therebetween on the external surface of the elementary body 2 in such a manner that an end of one opposing electrode 3 or 4 is opposed to an end of the other opposing electrode. In addition, the opposing electrodes 3 and 4 may be disposed at substantially the same plane within the elementary body 2 such that an end of one opposing electrode 3 or 4 is opposed to an end of the other opposing electrode.

The reason that the opposing electrodes 3 and 4 are disposed within the elementary body 2 such that a small portion of the elementary body 2 is disposed between the electrodes 3 and 4 is that such an arrangement provides at least a predetermined mechanical strength to the elementary body 2 while the distance is reduced between the opposing electrodes 3 and 4. If the mechanical strength of the elementary body 2 is not important, the opposing electrodes may be disposed on a main surface of a thin elementary body.

In addition, while the opposing electrodes 3 and 4 are preferably used not only to apply a switching voltage, but also to measure the current (to measure the resistance) the opposing electrodes 3 and 4 may be used only to apply a voltage and other electrodes may be provided to measure the current. In this instance, first, second, and third electrodes may preferably be arranged in that order so as to oppose each other. The first and second electrodes are preferably used to measure the current, the first and third electrodes may be used to apply a voltage using the first electrode as common electrode, or the first and second electrodes may be used to apply a voltage and the first and third electrodes may be used to measure the current.

In order to confirm that various preferred embodiments of the present invention produces the above-described advantages, and in order to determine a preferred ranges for the preferred embodiments of the present invention, the following experiments were performed as described below.

Experimental Example 1

Powdered starting materials were prepared for a semiconductor ceramic of the elementary body, including strontium carbonate ($SrCO_3$), barium carbonate ($BaCO_3$), calcium carbonate ($CaCO_3$) and titanium oxide ($TiO_2$), and donors: lanthanum oxide ($La_2O_3$), samarium oxide ($Sm_2O_3$), gadolinium oxide ($Gd_2O_3$), dysprosium oxide ($Dy_2O_3$), yttrium oxide ($Y_2O_3$), niobium oxide ($Nb_2O_5$) and tantalum oxide ($Ta_2O_5$). These starting materials were weighed so that the compositions shown in Tables 1 to 6 were produced after firing.

Each sample shown in Table 1 contains Ba or Ca as M of the formula $\{(Sr_{1-x}M_x)_{1-y}A_y\}(Ti_{1-z}B_z)O_3$ and La as A, not containing B (z=0), and the content y of donor A, that is, La, and the amount x of substituent M at the Sr site were varied.

Each sample shown in Table 2 contains Ba or Ca as M of the formula $\{(Sr_{1-x}M_x)_{1-y}A_y\}(Ti_{1-z}B_z)O_3$ and Nb as B, not containing A (y=0), and the content z of donor B, that is, Nb, and the amount x of substituent M at the Sr site were varied.

Each sample shown in Table 3 contains Ba as M of the formula $\{(Sr_{1-x}M_x)_{1-y}A_y\}(Ti_{1-z}B_z)O_3$, and Sm, Gd, Dy or Y as A, not containing B (z=0), and the content y of donor A, that is, Sm, Gd, Dy or Y, and the amount x of substituent M at the Sr site were varied.

Each sample shown in Table 4 contains Ca as M of the formula $\{(Sr_{1-x}M_x)_{1-y}A_y\}(Ti_{1-z}B_z)O_3$ and Sm, Gd, Dy or Y as A, not containing B (z=0), and the content y of donor A, that is, Sm, Gd, Dy or Y, and the amount x of substituent M at the Sr site were varied.

Each sample shown in Table 5 contains Ba or Ca as M of the formula $\{(Sr_{1-x}M_x)_{1-y}A_y\}(Ti_{1-z}B_z)O_3$ and Ta as B, not containing A (y=0), and the content z of donor B, that is, Ta, and the amount x of substituent M at the Sr site were varied.

Each sample shown in Table 6 contains Ba or Ca as M of the formula $\{(Sr_{1-x}M_x)_{1-y}A_y\}(T_{1-z}B_z)O_3$, La as A, and Nb as B, and varied in the contents y and z of donor A and B, that is, La and Nb, the sum y+z of these contents, and the amount x of substituent M at the Sr site.

The starting materials weighed so that the compositions shown in Tables 1 to 6 were produced after firing. Then a dispersant and water were added to the weighed materials, and the materials were pulverized and mixed together with PSZ balls of about 2 mm in diameter for about 24 hours in a wet process. After pulverization, the resulting slurry was dried and calcined at about 1200° C. for about 4 hours in the air. The resulting calcined powder and a dispersant were added into pure water, and the powder was pulverized with PSZ balls of 5 mm in diameter for 24 hours. Then, an acrylic binder, a plasticizer, an antifoaming agent and other additives were added to the powder. The powder was mixed again for about 12 hours to yield a green sheet slurry.

The resulting slurry was formed into green sheets by the doctor blade method. The thickness of the green sheet was adjusted to about 40 μm. Then, the green sheets were cut into oblong strips, and an electroconductive paste containing Pd was screen-printed on some of the green sheets to form the opposing electrodes. Subsequently, a plurality of green sheets including the green sheets on which the electroconductive paste had been applied for the opposing electrodes were stacked one on top of another. The stack was pressed and cut into green chips measuring 2.0 mm by 1.2 mm by 1.2 mm. Each green chip was adjusted so that the opposing area defined by the opposing electrodes would be about 1 mm.

Then, the green chip was degreased at 550° C. in the air, and subsequently fired at a temperature of 1300 to 1400° C. for 2 hours. The firing temperature depends on the Ba or Ca content, and accordingly it was appropriately set at a temperature at which the particle size of the sample would be about 3 to 5 μm for each sample. Then, the green chip was subjected to reduction at an appropriate temperature of 600 to 1200° C. for 4 hours in an atmosphere of nitrogen containing 3% of hydrogen.

An electroconductive paste containing Ag was applied onto the elementary body after firing to form the terminal electrodes and was burned at 750° C. in the air. The resulting samples were subjected to evaluation tests.

The test samples were subjected to electroforming for correct evaluation by applying pulsed voltages of 100 to 200 V with a pulse width of 100 ms 10 to 50 times in the positive direction and the opposite direction each, and then the I-V characteristics were evaluated.

For the I-V characteristics evaluation, voltages were swept in this order: 0 V→predetermined voltage (positive)→0 V→predetermined voltage (negative)→0 V, using a pulse source meter ADVANTEST R6246. The voltages were pulsed and the measurements were made at a pulse width of 0.1 s. FIG. 2 shows an example of the I-V curves thus prepared. The I-V characteristics shown in FIG. 2 are those of a specific sample shown in Table 1 as described above, that is, a sample containing Ba as M (amount x of substituent M or Ba: 1.000) and La as A in a content y of 0.008.

The maximum resistance variation was determined according to the I-V characteristics obtained as above. The maximum resistance variation was measured at a voltage more than 5 V in the polarity (positive in FIG. 2) at the time when a low resistance state changes into a high resistance state, at which the difference between the low resistance state and the high resistance state is largest, and was calculated from the equation: Resistance variation $(\%)=(\rho_H-\rho_L)/\rho_L\times 100$, wherein $\rho_H$ represents the resistance in a high resistance state and $\rho_L$ represents the resistance in a low resistance state. For example, the maximum resistance variation of each sample shown in FIG. 2 was obtained at a voltage of −5 V or less (absolute value of 5 V or more), at which the resistance variation was the largest. The reason why the maximum resistance variation was obtained in that manner is that the resistances of resistance memory elements have voltage dependence.

Tables 1 to 6 show maximum resistance variations (unit: %) obtained as above. Blank cells not showing maximum resistance variation in Tables 1 to 6 mean that resistance switching did not occur or the resistance variation was too small to measure.

TABLE 1

$\{(Sr_{1-x}M_x)_{1-y}A_y\}(Ti_{1-z}B_z)O_3$

| | | Donor | M substitution amount (x) | | | | | |
|---|---|---|---|---|---|---|---|---|
| M | A | content (y) | 0 | 0.2 | 0.4 | 0.5 | 0.8 | 1.0 |
| Ba | La | 0 | — | — | — | — | — | — |
| Ba | La | 0.0005 | 3300 | 2600 | 1600 | 2900 | — | — |
| Ba | La | 0.001 | 5400 | 5200 | 5100 | 5300 | 3500 | 3100 |
| Ba | La | 0.003 | 6950 | 6400 | 7500 | 7150 | 5200 | 4250 |
| Ba | La | 0.005 | 11500 | 10500 | 12500 | 10000 | 6100 | 5050 |
| Ba | La | 0.008 | 29500 | 25000 | 21500 | 10600 | 7500 | 5100 |
| Ba | La | 0.01 | 12500 | 13500 | 10500 | 11000 | 6300 | 5050 |
| Ba | La | 0.02 | 6250 | 5600 | 6000 | 5600 | 5100 | 4400 |
| Ba | La | 0.03 | 2300 | 1500 | 2700 | 2200 | 3100 | 1300 |
| Ca | La | 0 | — | — | — | — | — | — |
| Ca | La | 0.0005 | 3300 | 3600 | 2300 | 2100 | — | — |
| Ca | La | 0.001 | 5400 | 5100 | 5500 | 5050 | 3200 | 3200 |
| Ca | La | 0.003 | 6950 | 5500 | 7150 | 6900 | 5200 | 3900 |
| Ca | La | 0.005 | 11500 | 12400 | 11000 | 10500 | 6000 | 5100 |
| Ca | La | 0.008 | 29500 | 19000 | 16200 | 11200 | 7700 | 5050 |
| Ca | La | 0.01 | 12500 | 11300 | 12500 | 10200 | 5800 | 5200 |
| Ca | La | 0.02 | 6250 | 6150 | 5600 | 5900 | 5200 | 3900 |
| Ca | La | 0.03 | 2300 | 2000 | 3300 | 2200 | — | — |

TABLE 2

$\{(Sr_{1-x}M_x)_{1-y}A_y\}(Ti_{1-z}B_z)O_3$

| | | Donor | M substitution amount (x) | | | | | |
|---|---|---|---|---|---|---|---|---|
| M | B | content (z) | 0 | 0.2 | 0.4 | 0.5 | 0.8 | 1.0 |
| Ba | Nb | 0 | — | — | — | — | — | — |
| Ba | Nb | 0.0005 | 3000 | 3200 | 2200 | 2500 | — | — |
| Ba | Nb | 0.001 | 6200 | 5450 | 5600 | 5200 | 3200 | 3000 |
| Ba | Nb | 0.003 | 7150 | 6600 | 7100 | 7300 | 5050 | 3900 |
| Ba | Nb | 0.005 | 10500 | 12000 | 11100 | 13000 | 5500 | 5100 |
| Ba | Nb | 0.008 | 16200 | 18500 | 12500 | 11000 | 6200 | 5600 |
| Ba | Nb | 0.01 | 10500 | 12500 | 10500 | 12100 | 5800 | 5200 |
| Ba | Nb | 0.02 | 7200 | 6000 | 5500 | 6000 | 5400 | 3900 |
| Ba | Nb | 0.03 | 3100 | 2300 | 3200 | 3000 | 3500 | — |
| Ca | Nb | 0 | — | — | — | — | — | — |
| Ca | Nb | 0.0005 | 3000 | 2500 | 3000 | 2300 | — | 2300 |
| Ca | Nb | 0.001 | 6200 | 5090 | 6600 | 5600 | 4000 | 3500 |
| Ca | Nb | 0.003 | 7150 | 6000 | 7000 | 5500 | 6200 | 3500 |
| Ca | Nb | 0.005 | 10500 | 11200 | 10500 | 10500 | 5500 | 5050 |
| Ca | Nb | 0.008 | 16200 | 10500 | 16000 | 12200 | 7500 | 5100 |
| Ca | Nb | 0.01 | 10500 | 12500 | 11000 | 10900 | 6000 | 5300 |

TABLE 2-continued $\{(Sr_{1-x}M_x)_{1-y}A_y\}(Ti_{1-z}B_z)O_3$

| | | Donor | M substitution amount (x) | | | | | |
|---|---|---|---|---|---|---|---|---|
| M | B | content (z) | 0 | 0.2 | 0.4 | 0.5 | 0.8 | 1.0 |
| Ca | Nb | 0.02 | 7200 | 7700 | 6200 | 6000 | 5400 | 2600 |
| Ca | Nb | 0.03 | 3100 | 3200 | 2000 | 3200 | 3200 | — |

TABLE 3

$\{(Sr_{1-x}M_x)_{1-y}A_y\}(Ti_{1-z}B_z)O_3$

| | | Donor | M substitution amount (x) | | | | |
|---|---|---|---|---|---|---|---|
| M | A | content (y) | 0 | 0.25 | 0.5 | 0.8 | 1.0 |
| Ba | Sm | 0.0005 | 2500 | — | 2600 | 2600 | — |
| Ba | Sm | 0.001 | 5910 | 5500 | 5200 | 3900 | — |
| Ba | Sm | 0.003 | 6800 | 7100 | 6900 | 5050 | 3900 |
| Ba | Sm | 0.005 | 11200 | 12500 | 10500 | 5400 | 5050 |
| Ba | Sm | 0.01 | 11250 | 10500 | 12600 | 6300 | 5100 |
| Ba | Sm | 0.02 | 6200 | 6600 | 7000 | 5500 | 3900 |
| Ba | Sm | 0.03 | 3500 | 3200 | 4050 | 3300 | — |
| Ba | Gd | 0.0005 | 2000 | 1800 | 3200 | — | — |
| Ba | Gd | 0.001 | 5410 | 5050 | 5300 | 2900 | 1100 |
| Ba | Gd | 0.003 | 7150 | 8800 | 9000 | 5130 | 2900 |
| Ba | Gd | 0.005 | 11640 | 10800 | 11400 | 5600 | 5100 |
| Ba | Gd | 0.01 | 13200 | 14000 | 10900 | 6200 | 5300 |
| Ba | Gd | 0.02 | 5900 | 6300 | 7400 | 5400 | 2100 |
| Ba | Gd | 0.03 | 2250 | 3000 | 3100 | 2900 | 1800 |
| Ba | Dy | 0.0005 | 3000 | — | 2900 | — | — |
| Ba | Dy | 0.001 | 6120 | 5500 | 5400 | 3900 | — |
| Ba | Dy | 0.003 | 6500 | 9050 | 8600 | 5200 | 3300 |
| Ba | Dy | 0.005 | 11250 | 10800 | 11000 | 6300 | 5600 |
| Ba | Dy | 0.01 | 10800 | 12500 | 11900 | 5500 | 5400 |
| Ba | Dy | 0.02 | 7150 | 7700 | 6800 | 5400 | 2400 |
| Ba | Dy | 0.03 | 3250 | 3400 | 2400 | 2200 | — |
| Ba | Y | 0.0005 | 2750 | 3000 | 3900 | 2300 | — |
| Ba | Y | 0.001 | 5690 | 6000 | 5600 | 3400 | — |
| Ba | Y | 0.003 | 7450 | 7600 | 6900 | 5500 | 3300 |
| Ba | Y | 0.005 | 12500 | 11500 | 10500 | 5900 | 5600 |
| Ba | Y | 0.01 | 11680 | 11500 | 11100 | 5400 | 5150 |
| Ba | Y | 0.02 | 6500 | 7000 | 6200 | 5700 | 4200 |
| Ba | Y | 0.03 | 2450 | 3600 | 3300 | 2400 | 3200 |

TABLE 4

$\{(Sr_{1-x}M_x)_{1-y}A_y\}(Ti_{1-z}B_z)O_3$

| | | Donor | M substitution amount (x) | | | | |
|---|---|---|---|---|---|---|---|
| M | A | content (y) | 0 | 0.25 | 0.5 | 0.8 | 1.0 |
| Ca | Sm | 0.0005 | 2500 | — | 2600 | — | — |
| Ca | Sm | 0.001 | 5910 | 5200 | 5500 | 1500 | — |
| Ca | Sm | 0.003 | 6800 | 6600 | 6100 | 5600 | — |
| Ca | Sm | 0.005 | 11200 | 12600 | 10600 | 5600 | 5200 |
| Ca | Sm | 0.01 | 11250 | 10900 | 12000 | 6850 | 5100 |
| Ca | Sm | 0.02 | 6200 | 5500 | 6200 | 5900 | 3300 |
| Ca | Sm | 0.03 | 3500 | 3600 | 2100 | 3300 | 2500 |
| Ca | Gd | 0.0005 | 2000 | 2200 | — | 1500 | — |
| Ca | Gd | 0.001 | 5410 | 6000 | 5100 | 1900 | 2300 |
| Ca | Gd | 0.003 | 7150 | 6400 | 6900 | 5050 | 1800 |
| Ca | Gd | 0.005 | 11640 | 12200 | 10500 | 5000 | 5450 |
| Ca | Gd | 0.01 | 13200 | 13000 | 11000 | 6200 | 5100 |
| Ca | Gd | 0.02 | 5900 | 7100 | 8800 | 5400 | 2900 |
| Ca | Gd | 0.03 | 2250 | 3100 | 3300 | 4150 | 2400 |
| Ca | Dy | 0.0005 | 3000 | 2900 | — | — | 1500 |
| Ca | Dy | 0.001 | 6120 | 5550 | 5100 | 2600 | 2200 |
| Ca | Dy | 0.003 | 6500 | 6600 | 8400 | 5300 | 2600 |
| Ca | Dy | 0.005 | 11250 | 10700 | 10900 | 5250 | 5050 |
| Ca | Dy | 0.01 | 10800 | 11100 | 11400 | 5600 | 5150 |
| Ca | Dy | 0.02 | 7150 | 9100 | 7500 | 5500 | 3400 |
| Ca | Dy | 0.03 | 3250 | 3200 | 3300 | 2700 | 1900 |

TABLE 4-continued $\{(Sr_{1-x}M_x)_{1-y}A_y\}(Ti_{1-z}B_z)O_3$

| M | A | Donor content (y) | M substitution amount (x) | | | | |
|---|---|---|---|---|---|---|---|
| | | | 0 | 0.25 | 0.5 | 0.8 | 1.0 |
| Ca | Y | 0.0005 | 2750 | — | 2100 | — | — |
| Ca | Y | 0.001 | 5690 | 5400 | 5500 | 3600 | — |
| Ca | Y | 0.003 | 7450 | 6200 | 9050 | 5420 | 3200 |
| Ca | Y | 0.005 | 12500 | 10100 | 12000 | 5900 | 5600 |
| Ca | Y | 0.01 | 11680 | 11300 | 11500 | 6150 | 5500 |
| Ca | Y | 0.02 | 6500 | 7050 | 6800 | 5050 | 2260 |
| Ca | Y | 0.03 | 2450 | 3200 | 3300 | 4400 | — |

TABLE 5

$\{(Sr_{1-x}M_x)_{1-y}A_y\}(Ti_{1-z}B_z)O_3$

| M | B | Donor content (z) | M substitution amount (x) | | | | |
|---|---|---|---|---|---|---|---|
| | | | 0 | 0.25 | 0.5 | 0.8 | 1.0 |
| Ba | Ta | 0.0005 | 2500 | 3050 | 2500 | — | 1100 |
| Ba | Ta | 0.001 | 6100 | 5500 | 5160 | 3200 | — |
| Ba | Ta | 0.003 | 6400 | 7200 | 7700 | 5140 | 3500 |
| Ba | Ta | 0.005 | 10500 | 11000 | 10300 | 5100 | 5900 |
| Ba | Ta | 0.01 | 13500 | 13000 | 10800 | 6050 | 5050 |
| Ba | Ta | 0.02 | 7000 | 6200 | 6300 | 5500 | 4100 |
| Ba | Ta | 0.03 | 3200 | 2800 | 3300 | 3700 | 2200 |
| Ca | Ta | 0.0005 | 2500 | 2100 | — | — | 1000 |
| Ca | Ta | 0.001 | 6100 | 5600 | 5100 | 3100 | — |
| Ca | Ta | 0.003 | 6400 | 5700 | 5900 | 5400 | 2500 |
| Ca | Ta | 0.005 | 10500 | 11300 | 10500 | 5550 | 5150 |
| Ca | Ta | 0.01 | 13500 | 10500 | 11900 | 6250 | 5000 |
| Ca | Ta | 0.02 | 7000 | 7200 | 6420 | 5900 | — |
| Ca | Ta | 0.03 | 3200 | 3150 | 1800 | 3150 | — |

TABLE 6

$\{(Sr_{1-x}M_x)_{1-y}A_y\}(Ti_{1-z}B_z)O_3$

| M | A | B | Donor content A: y, B: z | M substitution amount (x) | | | | |
|---|---|---|---|---|---|---|---|---|
| | | | | 0 | 0.25 | 0.5 | 0.8 | 1.0 |
| Ba | La | Nb | 0.0005 (La: 0.0002, Nb: 0.0003) | 3100 | 2000 | 2300 | — | 2000 |
| Ba | La | Nb | 0.001 (La: 0.0005, Nb: 0.0005) | 7000 | 6100 | 7900 | — | 1900 |
| Ba | La | Nb | 0.003 (La: 0.001, Nb: 0.002) | 8200 | 8100 | 7500 | 5400 | 4050 |
| Ba | La | Nb | 0.005 (La: 0.003, Nb: 0.002) | 10500 | 10800 | 10300 | 5500 | 5300 |
| Ba | La | Nb | 0.001 (La: 0.005, Nb: 0.005) | 12200 | 11200 | 10200 | 6000 | 5500 |
| Ba | La | Nb | 0.02 (La: 0.01, Nb: 0.01) | 8800 | 7600 | 6300 | 6100 | 4600 |
| Ba | La | Nb | 0.03 (La: 0.01, Nb: 0.02) | 4100 | 3800 | 1900 | 3900 | 2200 |
| Ca | La | Nb | 0.0005 (La: 0.0002, Nb: 0.0003) | 3100 | 2900 | — | — | — |
| Ca | La | Nb | 0.001 (La: 0.0005, Nb: 0.0005) | 7000 | 6800 | 5550 | 1500 | — |
| Ca | La | Nb | 0.003 (La: 0.001, Nb: 0.002) | 8200 | 7090 | 5900 | 5200 | 3000 |
| Ca | La | Nb | 0.005 (La: 0.003, Nb: 0.002) | 10500 | 12000 | 10300 | 5500 | 6250 |
| Ca | La | Nb | 0.001 (La: 0.005, Nb: 0.005) | 12200 | 11000 | 10000 | 5500 | 5900 |
| Ca | La | Nb | 0.02 (La: 0.01, Nb: 0.01) | 8800 | 7600 | 5200 | 5400 | 3600 |
| Ca | La | Nb | 0.03 (La: 0.01, Nb: 0.02) | 4100 | 2950 | — | 3300 | — |

When the amount x of substituent M, that is, Ba or ca, at the Sr site in the composition of the semiconductor ceramic of the elementary body satisfied $0<x\leq0.5$ and $0.001\leq y+z\leq0.02$ held, when the amount x satisfied $0.5<x\leq0.8$ and $0.003\leq y+z\leq0.02$ held, or when the amount x satisfied $0.8<x\leq1.0$ and $0.005\leq y+z\leq0.01$ held, the resistance was changed at a high rate of 5000% or more.

On the other hand, the samples in which the amount y of substituent A, that is, La, Sm, Gd, Dy or Y, was less than 0.001 did not exhibit the hysteresis of the I-V characteristics as shown in FIG. 2, or resistance variations of 5000% or more, because such a semiconductor ceramic does not turn into a semiconductor due to lack of donor and, consequently, Schottky barriers cannot be formed at the interfaces with the opposing electrodes.

In contrast, in the samples in which the amount y of substituent A, that is, La, Sm, Gd, Dy or Y, was more than 0.02, the donor content was excessive and the resistance of the ceramic was excessively reduced. Consequently, the height of Schottky barrier was reduced and thus the resistance variation was less than 5000%.

When the amount x of M, that is, Ba or Ca, satisfied $0<x\leq0.5$ and the amount y of A, that is, La, Sm, Gd, Dy or Y satisfied $0.005\leq y+z\leq0.01$, a still larger resistance variation of 10000% or more was achieved. This shows that by appropriately controlling the amount x of substituent M, that is, Ba or Ca, and/or the amount y of substituent A, that is, La, Sm, Gd, Dy or Y, optimal Schottky barriers and grain boundaries can be produced.

Experimental Example 2

Samples shown in Tales 7 and 8 were extracted from the samples shown in Tables 1 to 6, and the absolute value of the switching voltage was measured on each sample. The switching voltage mentioned here is defined as the voltage at the inflection point at which the current starts decreasing even though the applied voltage is increased from 0 V, that is, at the point corresponding to +20 V in FIG. 2, in the polarity in which the resistance state in the I-V characteristics is switched from a low resistance state to a high resistance state.

TABLE 7

$\{(Sr_{1-x}M_x)_{1-y}A_y\}(Ti_{1-z}B_z)O_3$

| M | A | B | x | y | z | Resistance variation (%) | Switching voltage (V) |
|---|---|---|---|---|---|---|---|
| Ba | La | — | 0.2 | 0.008 | 0 | 25000 | 49 |
| Ba | La | — | 0.4 | 0.008 | 0 | 21500 | 45 |
| Ba | La | — | 0.5 | 0.008 | 0 | 10600 | 40 |
| Ba | La | — | 0.8 | 0.008 | 0 | 7500 | 32 |
| Ba | La | — | 1 | 0.008 | 0 | 5100 | 22 |
| Ba | — | — | 0.5 | 0 | 0 | — | — |

TABLE 7-continued $\{(Sr_{1-x}M_x)_{1-y}A_y\}(Ti_{1-z}B_z)O_3$

| M | A | B | x | y | z | Resistance variation (%) | Switching voltage (V) |
|---|---|---|---|---|---|---|---|
| Ba | La | — | 0.5 | 0.0005 | 0 | 2900 | 68 |
| Ba | La | — | 0.5 | 0.001 | 0 | 5300 | 55 |
| Ba | La | — | 0.5 | 0.003 | 0 | 7150 | 56 |
| Ba | La | — | 0.5 | 0.005 | 0 | 10000 | 45 |
| Ba | La | — | 0.5 | 0.008 | 0 | 10600 | 40 |
| Ba | La | — | 0.5 | 0.01 | 0 | 11000 | 40 |
| Ba | La | — | 0.5 | 0.02 | 0 | 5600 | 42 |
| Ba | La | — | 0.5 | 0.03 | 0 | 2200 | 51 |
| Ba | — | — | 0.5 | 0 | 0 | — | — |
| Ba | — | Nb | 0.5 | 0 | 0.0005 | 2500 | 71 |
| Ba | — | Nb | 0.5 | 0 | 0.001 | 5200 | 56 |
| Ba | — | Nb | 0.5 | 0 | 0.003 | 7300 | 60 |
| Ba | — | Nb | 0.5 | 0 | 0.005 | 13000 | 45 |
| Ba | — | Nb | 0.5 | 0 | 0.008 | 11000 | 49 |
| Ba | — | Nb | 0.5 | 0 | 0.01 | 12100 | 41 |
| Ba | — | Nb | 0.5 | 0 | 0.02 | 6000 | 45 |
| Ba | — | Nb | 0.5 | 0 | 0.03 | 3000 | 46 |
| Ba | La | Nb | 0.25 | 0.005 | 0.005 | 11200 | 52 |
| Ba | La | Nb | 0.5 | 0.005 | 0.005 | 10200 | 43 |
| Ba | Sm | — | 0.5 | 0.005 | 0 | 10500 | 45 |
| Ba | Gd | — | 0.5 | 0.005 | 0 | 11400 | 49 |
| Ba | Dy | — | 0.5 | 0.005 | 0 | 11000 | 46 |
| Ba | Y | — | 0.5 | 0.005 | 0 | 10500 | 41 |
| Ba | — | Ta | 0.5 | 0 | 0.005 | 10300 | 59 |

TABLE 8

$\{(Sr_{1-x}M_x)_{1-y}A_y\}(Ti_{1-z}B_z)O_3$

| M | A | B | x | y | z | Resistance variation (%) | Switching voltage (V) |
|---|---|---|---|---|---|---|---|
| Ca | La | — | 0.2 | 0.008 | 0 | 19000 | 50 |
| Ca | La | — | 0.4 | 0.008 | 0 | 16200 | 55 |
| Ca | La | — | 0.5 | 0.008 | 0 | 11200 | 56 |
| Ca | La | — | 0.8 | 0.008 | 0 | 7700 | 60 |
| Ca | La | — | 1 | 0.008 | 0 | 5050 | 61 |
| Ca | — | — | 0.5 | 0 | 0 | — | — |
| Ca | La | — | 0.5 | 0.0005 | 0 | 2300 | 65 |
| Ca | La | — | 0.5 | 0.001 | 0 | 5500 | 55 |
| Ca | La | — | 0.5 | 0.003 | 0 | 7150 | 61 |
| Ca | La | — | 0.5 | 0.005 | 0 | 11000 | 61 |
| Ca | La | — | 0.5 | 0.008 | 0 | 16200 | 55 |
| Ca | La | — | 0.5 | 0.01 | 0 | 12500 | 59 |
| Ca | La | — | 0.5 | 0.02 | 0 | 5600 | 51 |
| Ca | La | — | 0.5 | 0.03 | 0 | 3300 | 50 |
| Ca | — | — | 0.5 | 0 | 0 | — | — |
| Ca | — | Nb | 0.5 | 0 | 0.0005 | 2300 | 62 |
| Ca | — | Nb | 0.5 | 0 | 0.001 | 5600 | 59 |
| Ca | — | Nb | 0.5 | 0 | 0.003 | 5500 | 60 |
| Ca | — | Nb | 0.5 | 0 | 0.005 | 10500 | 57 |
| Ca | — | Nb | 0.5 | 0 | 0.008 | 12200 | 55 |
| Ca | — | Nb | 0.5 | 0 | 0.01 | 10900 | 43 |
| Ca | — | Nb | 0.5 | 0 | 0.02 | 6000 | 46 |
| Ca | — | Nb | 0.5 | 0 | 0.03 | 3200 | 49 |
| Ca | La | Nb | 0.25 | 0.005 | 0.005 | 11000 | 66 |
| Ca | La | Nb | 0.5 | 0.005 | 0.005 | 10000 | 59 |
| Ca | Sm | — | 0.5 | 0.005 | 0 | 10600 | 62 |
| Ca | Gd | — | 0.5 | 0.005 | 0 | 10500 | 60 |
| Ca | Dy | — | 0.5 | 0.005 | 0 | 10900 | 54 |
| Ca | Y | — | 0.5 | 0.005 | 0 | 12000 | 63 |
| Ca | — | Ta | 0.5 | 0 | 0.005 | 10500 | 59 |

As is clear from Tables 7 and 8, when the amount x of substituent M, that is, Ba or Ca, at the Sr site satisfies $0<x\leq0.5$ and $0.001\leq y+z\leq0.02$ holds, when the amount x satisfies $0.5<x\leq0.8$ and $0.003\leq y+z\leq0.02$ holds, or when the mount x satisfies $0.8<x\leq1.0$ and $0.005\leq y+z\leq0.01$ hold, a high switching voltage of 5 V or more can be achieved, and the resistance can change at a high rate of 5000% or more under conditions of high driving voltage.

Experimental Examples 1 and 2 used La, Sm, Gd, Dy or Y as a donor added to Sr and M. In addition to these elements, Ce, Pr, Nd, Eu, Tb, Ho, Er, Tm, Yb or Lu may be used to produce the same effects. Y and rare earth elements may be use in combination, and further Nb and Ta used as a donor added to Ti may also be used in combination. Such donors can produce the same effects.

In the experimental examples, a predetermined pulsed voltage was applied a plurality of times in a positive direction and the opposite direction each for electroforming. However, the pulsed voltage may be applied a plurality of times only in a single direction, or may be applied while a high voltage is swept in a single direction.

The invention claimed is:

1. A resistance memory element comprising:
an elementary body; and
at least one pair of electrodes separated by at least a portion of the elementary body,
wherein the at least one pair of electrodes are arranged such that when a switching voltage is applied in a first direction between the at least one pair of electrodes, the portion of the elementary body disposed between the pair of electrodes attains a low resistance state, and the low resistance state is maintained even after the switching voltage in the first direction is removed, and
when a switching voltage is applied in a second direction opposite to the first direction between the at least one pair of electrodes, the portion of the elementary body disposed between the pair of electrodes attains a high resistance state, and the high resistance state is maintained even after the switching voltage in the second direction is removed, and
wherein the elementary body is made of a semiconductor ceramic expressed by a formula $\{(Sr_{1-x}M_x)_{1-y}A_y\}(T_{1-z}B_z)O_3$,
wherein M represents at least one of Ba and Ca, A represents at least one element selected from the group consisting of Y and rare earth elements, and B represents at least one of Nb and Ta, and satisfies:
when $0<x\leq0.5$, $0.001\leq y+z\leq0.02$ (where $0\leq y\leq0.02$ and $0\leq z\leq0.02$);
when $0.5<x\leq0.8$, $0.003\leq y+z\leq0.02$ (where $0\leq y\leq0.02$ and $0\leq z\leq0.02$); and
when $0.8<x\leq1.0$, $0.005\leq y+z\leq0.01$ (where $0\leq y\leq0.02$ and $0\leq z\leq0.02$).

2. The resistance memory element according to claim 1, wherein the semiconductor ceramic satisfies $0<x\leq0.5$ and $0.005\leq y+z\leq0.01$ (where $0\leq y\leq0.02$ and $0\leq z\leq0.02$).

3. The resistance memory element according to claim 1, wherein the elementary body has at least one grain boundary between the pair of electrodes.

4. The resistance memory element according to claim 1, wherein the pair of electrodes are configured such that they are fired together with the elementary body when the resistance memory element is formed.

5. The resistance memory element according to claim 1, wherein the pair of electrodes contain at least one metal selected from the group consisting of Pd, Pt, Ag—Pd, Au, Ru, and Ir.

6. The resistance memory element according to claim 1, wherein a Schottky junction is formed between the pair of electrodes and the elementary body.

7. The resistance memory element according to claim 1, wherein a switching voltage of the resistance memory element is at least about 5V.

8. The resistance memory element according to claim 1, wherein a resistance of the resistance memory element changes at a rate of at least about 5000%.

9. The resistance memory element according to claim 1, wherein a resistance of the resistance memory element changes at a rate of at least about 10,000%.

10. The resistance memory element according to claim 1, wherein the pair of electrodes are configured so as to apply a switching voltage.

11. The resistance memory element according to claim 10, wherein the pair of electrodes are configured so as to measure a current.

12. The resistance memory element according to claim 1, wherein the pair of electrodes are configured so as to measure a current.

\* \* \* \* \*